United States Patent
Schuster et al.

(10) Patent No.: US 6,831,794 B2
(45) Date of Patent: Dec. 14, 2004

(54) OBJECTIVE WITH AT LEAST ONE ASPHERIC LENS

(75) Inventors: Karl-Heinz Schuster, Königsbronn (DE); Frank Schillke, Aalen (DE); Franz-Josef Stickel, Oberkochen (DE); Alexander Epple, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 10/600,288

(22) Filed: Jun. 21, 2003

(65) Prior Publication Data
US 2004/0212899 A1 Oct. 28, 2004

Related U.S. Application Data

(63) Continuation-in-part of application No. PCT/EP01/14314, filed on Dec. 6, 2001.

(30) Foreign Application Priority Data

Dec. 22, 2000 (DE) .......................................... 100 65 944

(51) Int. Cl.[7] ............................. G02B 3/02; G02B 3/00; H01H 43/02
(52) U.S. Cl. ....................... 359/708; 359/719; 359/649; 355/67
(58) Field of Search ................................ 359/708–719, 359/649, 754–756; 355/53, 67

(56) References Cited

U.S. PATENT DOCUMENTS 5,164,750 A 11/1992 Adachi ....................... 351/212
6,018,424 A * 1/2000 Morgan et al. .............. 359/708
6,075,650 A 6/2000 Morris et al. ................ 359/641
6,646,718 B2 * 11/2003 Schuster et al. .............. 355/67

FOREIGN PATENT DOCUMENTS

| DE | 198 18 444 A1 | 10/1998 | ........... G02B/13/18 |
| DE | 199 42 281 A1 | 11/2000 | ........... G02B/13/18 |
| EP | 0 332 201 B1 | 3/1989 | ........... G02B/13/00 |
| WO | WO 00 70407 A | 11/2000 | ............. G03F/7/20 |

OTHER PUBLICATIONS

International Search Report for PCT/EP01/14314 dated Apr. 26, 2002 by Daffner, M. from the European Patent Office.

* cited by examiner

Primary Examiner—Georgia Epps
Assistant Examiner—Jack Dinh

(57) ABSTRACT

A lens has at least one aspheric lens surface, an objective with at least one aspheric lens surface, and a projection exposure device for microlithography and a method for the production of microstructured components with an objective having at least one aspheric lens surface. The object of the invention is to provide a method by which new designs with aspheric lens surfaces can be generated without consultation with manufacturing, with this object attained by the measure of describing the aspheric lens surfaces by Zernike polynomials, which makes it is possible to undertake a classification of aspheric lens surfaces such that the respective aspheric lens surface can be polished and tested at a justifiable cost when at least two of three, or all three, of certain conditions are present.

12 Claims, 4 Drawing Sheets

OBJECTIVE WITH AT LEAST ONE ASPHERIC LENS

CROSS REFERENCES TO RELATED APPLICATIONS

This Patent Application is a Continuation-In-Part of International Patent Application PCT/EP01/14314 filed Dec. 6, 2001, with a priority date of 22 Dec. 2000.

STATEMENT REGARDING FEDERALLY SPONSORED RESEARCH OR DEVELOPMENT

Not applicable.

BACKGROUND OF THE INVENTION

The invention relates to a lens with at least one aspheric lens surface, to an objective with at least one aspheric lens surface, and to a projection exposure device for microlithography and a method for the production of microstructured components with an objective having at least one aspheric lens surface.

Lenses with aspheric lens surfaces are increasingly used, particularly in projection objection objectives for microlithography, for improving imaging quality. For example, such projection objectives are known from German Patent Documents DE 198 18 444 A1, DE 199 42 281, U.S. Pat. Nos. 5,990,926, 4,948,328, and European Patent Document EP 332 201 B1.

Aspheric lenses are increasingly used in projection objection objectives for microlithography, for improving imaging quality. However, in order to attain the desired quality improvement by the use of lenses with aspheric lens surfaces, it is necessary that the actual shape of the aspheric lens surfaces does not deviate more than a predetermined amount form the reference data of the lens surface. The permissible deviations between the reference surface and the actual surface are very small in microlithography, because of the finer and finer structures to be imaged. For testing whether a present aspheric lens surface corresponds to the required lens surface within the range of measurement accuracy, a special test optics is required. The quality of the aspheric lens surface is tested with this test optics.

The complexity of such test optics depends definitively on the surface shape of the aspheric lens surface. In particular, the use is desirable of aspheric lenses whose aspheric lens surface can be tested by test optics which can be provided at a justifiable cost and which preferably consists of a small number of spherical lenses.

It can also be necessary in the production of aspheric lens surfaces for the aspheric lens surface to have to be tested and reworked repeatedly during the production process.

Due to polishing also, an undesired and non-uniform change of the surface shape can arise in dependence on the surface because of polishing removal, resulting in an impermissible change in the aspheric lens surface.

Furthermore, it can also happen with aspheric lenses of high asphericity, that is, with a large deviation from a spherical surface, and with a strong variation of the local curvature, that these surfaces can be polished only with very small polishing tools, with a very large polishing cost, or it is nearly impossible to polish the aspheric surface. Just in the process of designing objectives, it is not comfortable if the designer can only find out, by multiple consultations with the polishing specialist and with the specialist responsible for preparing the test optics, whether a design he has developed can be manufactured, or whether he has to change the design, so that a design exists which is also acceptable from manufacturing standpoints. Particularly when manufacture and development are spatially separated from one another, discussion and agreement between design and manufacturing entails a considerable cost in time.

SUMMARY OF THE INVENTION

The invention has as its object to provide a method by which new designs with aspheric lens surfaces can be generated without consultation with manufacturing.

The object of the invention is attained by the following features: By the measure of describing the aspheric lens surfaces by Zernike polynomials, it is possible to undertake a classification of aspheric lens surfaces such that the respective aspheric lens surface can be polished and tested at a justifiable cost when at least two of the three conditions (a)–(c) according to the following conditions are present:

$$P(h) = \frac{h^2}{R\left(1 + \sqrt{1 - \frac{h^2}{R^2}}\right)} + K0 + K4*Z4 + K9*Z9 + K10*Z16 +$$

$$K25*Z25 + K36*Z36 + K49*Z49 + K64*Z64$$

with

Z4=(2×h2−1)

Z9=(6h4−6h2+1)

Z16=(20h6−30h4+23h2−1)

Z25=(70h8−140h6+90h4−20 h2+1)

Z36=(252h10−630h8+560h6−210h 4+30 h2−1)

Z49=(924h12−27.72h 10+h3150h8−1680h6+h420h4−42h2+1)

Z64=(3432h14−12012h12+16632h110−h11550h8+4200h6−756h4+56h2−1)

where P is the sagitta as a function of the normed radial distance h from the optical axis 7:

$$h = \frac{\text{distance from the optical axis}}{\frac{1}{2}(\text{lens diameter of the aspheric})} = \text{normed radius}$$

$$0 < h \leq 1$$

and wherein at least two of the following conditions is fulfilled:

$$\left|\frac{K16}{K9}\right| < 0.7 \quad \text{(a)}$$

$$\left|\frac{K25}{K9}\right| < 0.1 \quad \text{(b)}$$

$$\left|\frac{K36}{K9}\right| < 0.02 \quad \text{(c)}$$

the radius of the aspheric lens surface being fixed so that K4=0.

The object of the invention is also achieved when all of the above conditions (a through c) are fulfilled.

Thus it is possible for the designer, without consultation with manufacturing, to be able to make a statement about whether his design can be tested and produced. The designer can limit himself to producing designs which can be tested and manufactured.

In particular, the presence of condition (c) has an advantageous effect on the manufacturability of aspheric lens surfaces. By the measure that the proportions resulting from the Zernike polynomial, relative to the normal radius, do not exceed the following contributions, a class of aspheric lens surface is created which are outstanding for easy manufacturability and testability. Those contributions are:

| Zernike polynomial Z9, | $\leq 300$ µm |
|---|---|
| Zernike polynomial Z16, | $\leq 35$ µm |
| Zernike polynomial Z25, | $\leq 5$ µm |
| Zernike polynomial Z36, | $\leq 1$ µm |
| Zernike polynomial Z49, | $\leq 0.02$ µm, |

By analogy to a vibrating air column or vibrating string, the coefficients Z16, Z25, Z49, Z64, etc. could be described as the overtones of the aspheric object. The poorer in overtones, i.e., the faster the decay of the amplitudes of the components from the Zernike polynomials Z16 and greater, the easier it is to manufacture an aspheric. Furthermore, a compensation optics having lenses, or a computer-generated hologram, for testing the aspheric thereby becomes substantially insensitive as regards tolerances. In addition, rapid decay of the amplitudes makes it possible to find an isoplanatic compensation optics. The natural decay of the amplitudes of the Zernike contributions is decisive for the quality of matching of the test optics to the aspheric lens surface (residual RMS value of the wavefront). This is clear from the example put forward, with a particularly harmonic decay of the higher Zenike amplitudes. It would also be undesirable to unnaturally decrease an individual higher Zernike term in its amplitude. A compensation optics of spherical lenses with a technically reasonable sin-i loading generates quite by itself a gently decaying amplitude pattern of higher Zernike terms.

It has furthermore been found to be advantageous to provide the aspheric lens surface on a convex lens surface. This has an advantageous effect on the polishing process.

It has been found to be advantageous to provide in an objective only aspheric lens surfaces which according to the characterization by Zernike polynomials are easily produced with the required accuracy.

It has been found to be advantageous, in order to further improve the effect of these aspheric lens surfaces, to arrange a spherical lens surface respectively neighboring the aspheric lens surface and having a radius which deviates at most by 30% from the radius of the aspheric lens surface. By this measure, a nearly equidistant air gap is formed between the aspheric lens surface and the adjacently arranged spherical lens surface. The designer is thereby freer in the curvature of the aspheric, which represents an additional important degree of freedom of the aspheric, without thereby making it difficult to manufacture the aspheric.

BRIEF DESCRIPTION OF THE FIGURES

Further advantageous measures are described in detail in further dependent claims using the embodiment examples.

DETAILED DESCRIPTION OF THE INVENTION

Figure 1:
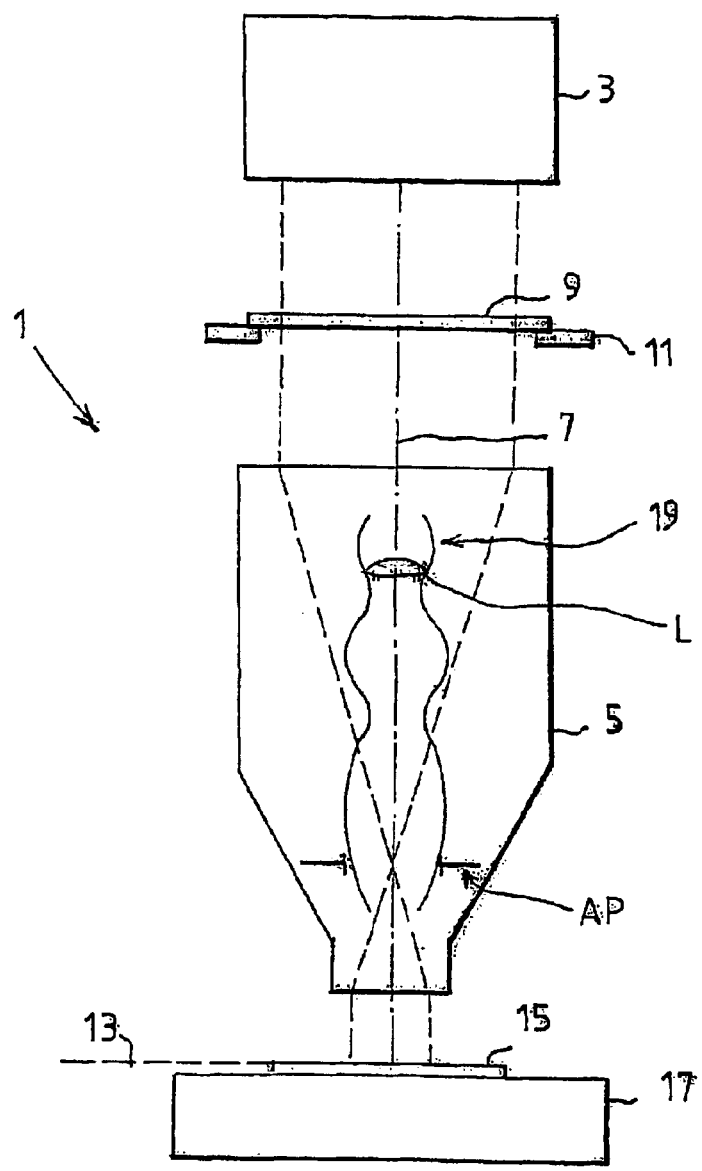
FIG. 1 shows a projection exposure device.

The structure of a projection exposure device is first described in principle with reference to FIG. 1. The projection exposure device has an exposure device 3 and a projection objective 5. The projection objective 5 includes a lens arrangement 19 with an aperture diaphragm AP, an optical axis 7 being defined by the lens arrangement 19. A mask 9 is arranged between the exposure device 3 and projection objective 5, and is held in the beam path by a mask holder 11. Such masks 9 used in microlithography have a micrometer to nanometer structure which is imaged on an image plane 13 by means of the projection objective 5 with a reduction by a factor of up to 10, preferably a factor of 4. A substrate or a wafer 15 positioned by a substrate holder 17 is retained in the image plane 13. The minimum structures which can still be resolved depend on the wavelength $\lambda$ of the light used for the exposure and also on the aperture of the projection objective 5; the maximum attainable resolution of the projection exposure device increases with decreasing wavelength of the exposure device 3 and with increasing aperture of the projection objective 5.

Figure 2:
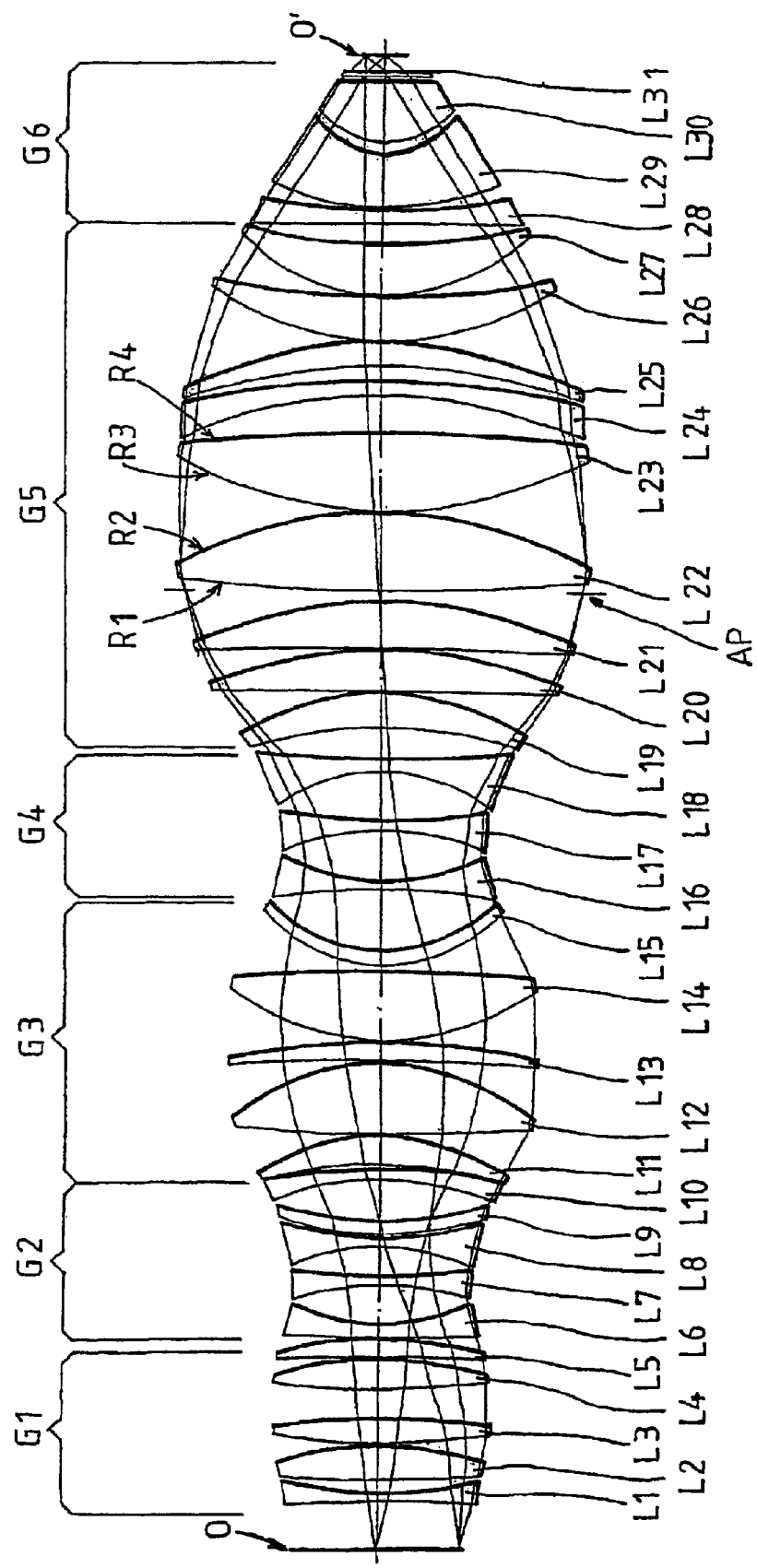
FIG. 2 shows a lens arrangement of a projection objective, designed for the wavelength 351 nm.

The lens arrangement 19 of a projection objective 5 for microlithography shown in FIG. 2 includes 31 lenses, which can be divided into six lens groups G1–G6. This lens arrangement is designed for the wavelength 351 nm.

The first lens group begins with a negative lens L1, followed by four positive lenses L2–L5. This first lens group has positive refractive power.

The second lens group G2 begins with a thick meniscus lens L6 of negative refractive power, with convex curvature toward the object. This negative lens is followed by two further negative lenses L7 and L8. The lens L9 following these is a meniscus lens of positive refractive power, which has a convex lens surface on the object side and is thus curved toward the object. As the last lens of the second lens group, a meniscus lens of negative refractive power is provided, curved toward the image, and is aspherized on the convex lens surface arranged on the image side. A correction of image errors in the region between the image field zone and image field edge is in particular possible by means of this aspheric lens surface in the second lens group G2. In particular, the image errors of higher order, which become evident on observing sagittal sections, are corrected. Since these image errors, visible in sagittal section, are particularly difficult to correct, this is a particularly valuable contribution.

The aspheric lens surface is mathematically described by the following equation with the Zernike polynomials Z9, Z16, Z25, Z49 and Z64. For the aspheric lens surface, there holds:

$$P(h) = \frac{h^2}{R\left(1 + \sqrt{1 - \frac{h^2}{R^2}}\right)} + K0 + K4*Z4 + K9*Z9 + K10*Z16 +$$

$$K25*Z25 + K36*Z36 + K49*Z49 + K64*Z64$$

with:

Z4=(2×h²−1)
Z9=(6h⁴−6h²+1)
Z16=(20h⁶−30h⁴+23h²−1)
Z25=(70h⁸−140h⁶+90h⁴−20h²+1)
Z36=(252h¹⁰−630h⁸+560h⁶−210h⁴+30h²−1)
Z49=(924h¹²−27.72h¹⁰+3150h⁸−1680h⁶+h420h⁴−42h²+1)
Z64=(3432h¹⁴−12012h¹²+16632h¹⁰−11550h⁸+4200h⁶−756h⁴+56h²−1)

where P is the sagitta as a function of the normed radial distance h from the optical axis 7:

$$h = \frac{\text{distance from the optical axis}}{\frac{1}{2}(\text{lens diameter of the aspheric})} = \text{normed radius}$$

$$0 < h \leq 1$$

The coefficients allocated to the Zernike polynomial and the radius are likewise given in the Tables, for describing the aspheric lens surface. The radius of the aspheric lens surface is fixed so that the following holds:

$$K4*Z4=0 \geq R$$

Other Zenike coefficients result with the selection of a differing radius. In particular, the Zernike polynomials of lower order would be changed. By selecting $K_4=0$ or nearly 0, statements about manufacturability and testability of the aspherics can be particularly easily derived from the Zernike coefficients. The component resulting from the Zernike polynomial Z9 contributes to spherical aberration of the third order. The portions resulting from the Zernike polynomial Z16 contribute to the correction of the fifth order spherical aberration. The contributions from the Zernike polynomial Z25 contribute to the correction of the seventh order spherical aberration, and the portions from the Zernike polynomial Z36 contribute to the correction of the ninth order spherical aberration.

The third lens group G3 is formed by the following five lenses L11–L15. Two thick positive lenses are arranged in the middle of the third lens group; their surfaces facing toward each other are strongly curved. A very thin positive lens L13 is arranged between these two thick positive lenses, and has practically no refractive power. This lens is of little importance, so that this lens can be dispensed with if required, with slight modifications of the objective structure. This third lens group has positive refractive power.

The fourth lens group G4 is formed by three negative lenses L16–L18 and thus has negative refractive power.

The fifth lens group is formed by lenses L19–L27. The diaphragm is arranged after the first three positive lenses L19–L21. Two thick positive lenses are arranged after the diaphragm, and their mutually facing surfaces have a strong curvature. This arrangement of the lenses L22 and L23 has an advantageous effect on the spherical aberration. Account is taken by means of this arrangement of the lenses L22 and L23 of the principle of "lens of best shape", i.e., strongly curved surfaces are situated in a ray path of approximately parallel rays. At the same time, specific contributions to the undercorrection of the oblique spherical aberration are provided and, in combination with the two following meniscuses L24 and L25, which have an overcorrecting action on oblique spherical aberration, make possible an outstanding overall correction. The focal lengths of these lenses are f12=465.405 mm and f34=448.462 mm.

The sixth lens group G6 principally has a negative lens L28, followed by two thick lenses. Differing from the example described, it can be advantageous for reducing compaction to use quartz glass for the last two lenses of this lens group.

This length of this objective, from the object plane 0 to the image plane 0', is 1,000 mm. The image field is 8×26 mm. The numerical aperture of this objective is 0.75. A bandwidth of about 2.5 pm is permissible with this objective. The exact lens data can be gathered from Table 1.

TABLE 1

M1440a

| Lens | Radius | Thickness | Glasses | ½ Lens Diameter | Refractive index at 351 nm |
|---|---|---|---|---|---|
| 0 | Infinity | 35.0240 | L710 | 60.887 | .999982 |
| L 1 | -908.93348 | 7.0000 | FK5 | 61.083 | 1.506235 |
|  | 284.32550 | 6.4165 | L710 | 63.625 | .999982 |
| L 2 | 968.84099 | 23.7611 | FK5 | 64.139 | 1.506235 |
|  | -212.21935 | .7000 | L710 | 66.550 | .999982 |
| L 3 | 413.73094 | 17.2081 | FK5 | 69.428 | 1.506235 |
|  | -424.88479 | 18.8724 | L710 | 69.711 | .999982 |
| L 4 | 591.81336 | 19.7102 | FK5 | 69.490 | 1.506235 |
|  | -250.67222 | .7000 | L710 | 69.228 | .999982 |
| L 5 | -2772.23751 | 12.8582 | FK5 | 67.060 | 1.506235 |
|  | -255.60433 | .7000 | L710 | 66.381 | .999982 |
| L 6 | 4699.63023 | 9.0382 | FK5 | 62.603 | 1.506235 |
|  | 120.65688 | 26.0302 | L710 | 56.905 | .999982 |
| L 7 | -182.28783 | 6.0000 | FK5 | 56.589 | 1.506235 |
|  | 302.39827 | 20.1533 | L710 | 57.318 | .999982 |
| L 8 | -140.55154 | 6.0000 | FK5 | 57.674 | 1.506235 |
|  | 205.78996 | .7000 | L710 | 64.913 | .999982 |
| L 9 | 197.09815 | 10.0000 | FK5 | 66.049 | 1.506235 |
|  | 223.79756 | 27.0961 | L710 | 68.261 | .999982 |
| L 10 | -191.72586 | 8.0000 | FK5 | 70.299 | 1.506235 |
|  | 340.27531 A | 2.2458 | L710 | 77.287 | .999982 |
| L 11 | -292.95078 | 19.3593 | FK5 | 77.813 | 1.506235 |
|  | -143.32621 | .7000 | L710 | 80.683 | .999982 |
| L 12 | 1440.49435 | 47.0689 | FK5 | 95.650 | 1.506235 |
|  | -155.30867 | .7000 | L710 | 98.253 | .999982 |
| L 13 | -2647.76343 | 13.8320 | FK5 | 100.272 | 1.506235 |
|  | -483.82832 | .7000 | L710 | 100.543 | .999982 |
| L 14 | 169.62760 | 45.9417 | FK5 | 99.308 | 1.506235 |
|  | -1090.68864 | 3.2649 | L710 | 96.950 | .999982 |
| L 15 | 102.07790 | 10.0000 | FK5 | 77.455 | 1.505235 |
|  | 100.38160 | 40.1873 | L710 | 73.370 | .999982 |
| L 16 | -504.79995 | 6.0000 | FK5 | 71.843 | 1.506235 |
|  | 130.61081 | 34.6867 | L710 | 64.992 | .999982 |
| L 17 | -153.51955 | 6.0000 | FK5 | 64.734 | 1.506235 |
|  | 284.44035 | 34.2788 | L710 | 67.573 | .999982 |
| L 18 | -114.12583 | 8.2925 | FK5 | 68.531 | 1.506235 |
|  | 731.33965 | 20.4412 | L710 | 84.132 | .999982 |
| L 19 | -291.19603 | 24.2439 | FK5 | 86.387 | 1.506235 |
|  | -173.68634 | .7000 | L710 | 93.185 | .999982 |
| L 20 | -10453.06716 | 28.2387 | FK5 | 111.655 | 1.506235 |
|  | -304.21017 | .7000 | L710 | 114.315 | .999982 |
| L 21 | -2954.65846 | 30.7877 | FK5 | 122.647 | 1.506235 |
|  | -312.03660 | .7000 | L710 | 124.667 | .999982 |
| Diaphragm | Infinity | .0000 |  | 131.182 | .999982 |
|  | Diaphragm | .0000 |  | 131.182 |  |
| L 22 | 1325.30512 | 52.2352 | FK5 | 133.384 | 1.506235 |
|  | -282.76663 | .7000 | L710 | 135.295 | .999982 |
| L 23 | 276.96510 | 52.6385 | FK5 | 134.809 | 1.506235 |
|  | -1179.05517 | 25.2703 | L710 | 132.935 | .999982 |
| L 24 | -311.05526 | 10.0000 | FK5 | 131.670 | 1.506235 |
|  | -587.25843 | 10.5026 | L710 | 130.474 | .999982 |
| L 25 | -374.19522 | 15.0000 | FK5 | 130.116 | 1.506235 |
|  | -293.45628 | .7000 | L710 | 130.127 | .999982 |
| L 26 | 198.19004 | 29.6167 | FK5 | 111.971 | 1.506235 |
|  | 535.50347 | .7000 | L710 | 109.450 | .999982 |
| L 27 | 132.82366 | 34.0368 | FK5 | 94.581 | 1.506235 |
|  | 361.69797 | 12.8838 | L710 | 90.620 | .999982 |
| L 28 | 7006.77771 | 9.7505 | FK5 | 88.792 | 1.506235 |
|  | 349.77435 | 1.0142 | L710 | 79.218 | .999982 |
| L 29 | 174.38688 | 38.8434 | FK5 | 73.443 | 1.506235 |
|  | 55.37159 | 4.9107 | L710 | 45.042 | .999982 |
| L 30 | 55.08813 | 42.8799 | FK5 | 43.842 | 1.506235 |
|  | 807.41351 | 1.9795 | L710 | 30.725 | .999982 |
|  | Infinity | 3.0000 | FK5 | 29.123 | 1.506235 |
|  | Infinity | 12.0000 |  | 27.388 | .999982 |

Figure 3:
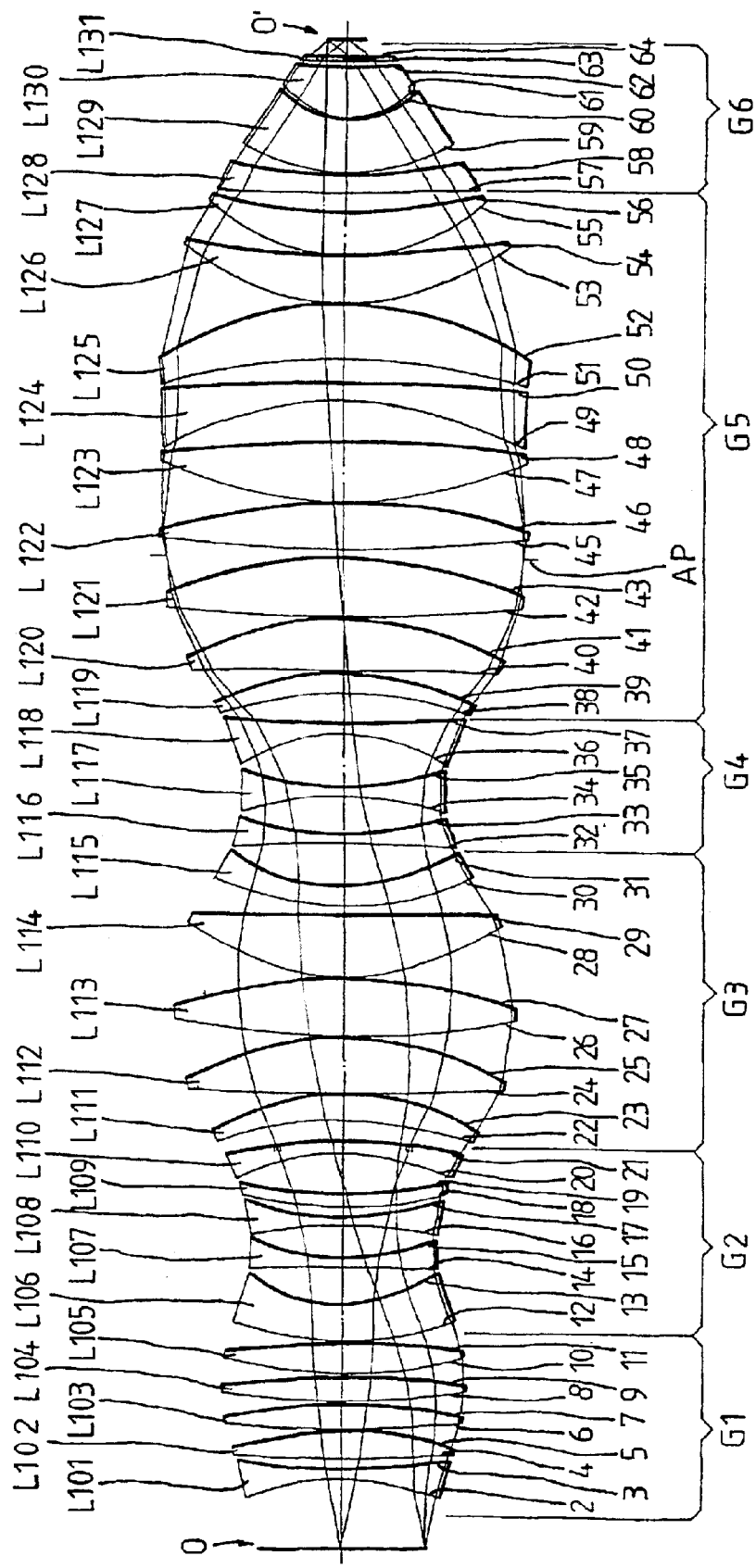
FIG. 3 shows a lens arrangement of a projection objective, designed for the wavelength 193 nm.

K4 = 0
K9 = 66445.43 nm
K16 = 33200.31 nm
K25 = 4553.78 nm
K36 = 843.85 nm
K49 = 172.24 nm
K64 = 30.49 nm
K0 = −37097.62 nm = offset A lens arrangement is shown in FIG. 3, designed for the wavelength 193 nm and including 31 lenses. These 31 lenses can be divided into six lens groups G1–G6.

The first lens group includes the lenses L101–L105 and has positive refractive power overall.

The second lens group G2 includes the lenses L106–L110. This lens group has overall negative refractive power, and a waist is formed by this lens group. The first three lenses L106–L108 have negative refractive power, the lens L109 being a meniscus lens curved away from the reticle and having positive refractive power. The lens L110 is a meniscus lens curved toward the wafer and provided on the image-side lens surface with an aspheric AS1. A nearly equidistant air gap, which comprises a thickness of at least 10 mm, is formed by this aspheric lens surface AS1 and the following spherical lens surface S2 of the lens L111.

The lens L111 already belongs to the lens group L3, which includes the lenses of positive refractive power L111–L115. This lens group G3 has positive refractive power overall.

The fourth lens group G4 is formed by the lenses L116–L118 and has negative refractive power.

The fifth lens group is formed by the lenses L119–L127 and has positive refractive power. A diaphragm is arranged between the lenses L121 and L122. The sixth lens group G6 is formed by the lenses L128–L131, and has positive refractive power.

In the third lens group, the lens L111 is made of $CaF_2$. The use of $CaF_2$ at this point contributes to reducing the transverse chromatic error.

Furthermore, the positive lenses around the diaphragm, i.e., two positive lenses before the diaphragm and the two positive lenses L122 and L123 after the diaphragm, are made of $CaF_2$. Since the longitudinal chromatic error depends both on the ray diameter and also on the refractive power, the chromatic errors can be compensated well in the region of the diaphragm, since the ray diameter is greatest there and the refractive powers of the lenses are relatively high. In contrast to the $CaF_2$ lens L111 in the third lens group G3, these $CaF_2$ lenses L120–L123 have a certain amount of inhomogeneities, which can be compensated by a specific surface deformation on the respective lens. This is possible since only small variation of the ray inclinations occurs here.

A further $CaF_2$ lens L130 is provided in the last lens group L6. With this lens L130, a lens is concerned with a particularly strong radiation loading, so that the use of the material $CaF_2$ contributes to minimizing compaction and lens heating, since the material $CaF_2$ shows smaller compaction effects than does quartz glass.

With this objective, a very well corrected objective is concerned, in which the deviation from the ideal wavefront $\leq 7.5$ m$\lambda$ with $\lambda=193$ nm. The distance between the object plane 0 and the image plane 0' is 1,000 mm and an image field of 8*26 mm² can be exposed. The numerical aperture is 0.76. The exact lens data can be gathered from Table 2.

TABLE 2

M1649a

| Surface | Radius | Thickness | Glasses | Refractive Index 193.304 nm | ½ Free Diameter |
|---|---|---|---|---|---|
| 0 | Infinity | 32.000000000 | L710 | 0.99998200 | 54.410 |
| 1 | Infinity | 14.179159189 | L710 | 0.99998200 | 60.478 |
| 2 | −164.408664394 | 6.500000000 | SIO2 | 1.56028900 | 60.946 |
| 3 | 477.741339202 | 7.790005801 | HE | 0.99971200 | 66.970 |
| 4 | 2371.284181560 | 17.748516367 | SIO2 | 1.56028900 | 69.245 |
| 5 | −223.822058173 | 0.700000000 | HE | 0.99971200 | 70.887 |
| 6 | 1195.174516496 | 16.908813880 | SIO2 | 1.56028900 | 75.328 |
| 7 | −310.690220530 | 0.700000000 | HE | 0.99971200 | 76.162 |
| 8 | 485.562118998 | 17.669364706 | SIO2 | 1.56028900 | 78.088 |
| 9 | −493.961769975 | 0.700000000 | HE | 0.99971200 | 78.165 |
| 10 | 283.324079929 | 21.403504698 | SIO2 | 1.56028900 | 76.991 |
| 11 | −575.651259941 | 0.700000000 | HE | 0.99971200 | 76.178 |
| 12 | 219.789049573 | 25.467779640 | SIO2 | 1.56028900 | 70.691 |
| 13 | 103.024318785 | 22.996372410 | HE | 0.99971200 | 59.994 |
| 14 | −1410.580832137 | 6.300000000 | SIO2 | 1.56028900 | 59.678 |
| 15 | 138.332121536 | 22.459549851 | HE | 0.99971200 | 58.321 |
| 16 | −258.063359303 | 6.300000000 | SIO2 | 1.56028900 | 58.777 |
| 17 | 211.150408840 | 4.720624389 | HE | 0.99971200 | 63.072 |
| 18 | 285.055583047 | 10.000000000 | SIO2 | 1.56028900 | 64.494 |
| 19 | 341.327971403 | 25.082030664 | HE | 0.99971200 | 66.580 |
| 20 | −155.970649922 | 8.215676832 | SIO2 | 1.56028900 | 68.121 |
| 21 | −340.915621 A | 13.915549894 | HE | 0.99971200 | 76.026 |
| 22 | −239.610088127 | 17.154283278 | CAF2HL | 1.50143600 | 81.795 |
| 23 | −158.430656481 | 0.700000000 | HE | 0.99971200 | 85.540 |
| 24 | 2921.942532737 | 36.745821475 | SIO2 | 1.56028900 | 100.629 |
| 25 | −199.180375968 | 0.700000000 | HE | 0.99971200 | 102.642 |
| 26 | 581.258911671 | 38.708808511 | SIO2 | 1.56028900 | 108.907 |
| 27 | −317.375895135 | 0.700000000 | HE | 0.99971200 | 109.183 |
| 28 | 166.493530930 | 41.501871919 | SIO2 | 1.56028900 | 100.340 |
| 29 | Infinity | 4.685571876 | HE | 0.99971200 | 97.519 |
| 30 | 189.438503324 | 15.000000000 | SIO2 | 1.56028900 | 82.804 |
| 31 | 129.565379485 | 27.721937943 | HE | 0.99971200 | 72.481 |
| 32 | −827.552674490 | 6.300000000 | SIO2 | 1.56028900 | 71.203 |
| 33 | 193.630934593 | 25.802720751 | HE | 0.99971200 | 65.619 |
| 34 | −188.509323766 | 6.300000000 | SIO2 | 1.56028900 | 65.012 |
| 35 | 190.247434306 | 36.481919216 | HE | 0.99971200 | 65.037 |
| 36 | −110.072588070 | 6.300000000 | SIO2 | 1.56028900 | 65.743 |
| 37 | 827.067219258 | 19.846860784 | HE | 0.99971200 | 78.180 |
| 38 | −240.277331422 | 13.611987588 | SIO2 | 1.56028900 | 80.133 |
| 39 | −184.012276263 | 0.700000000 | HE | 0.99971200 | 84.422 |
| 40 | −8088.819259729 | 34.993850995 | CAF2HL | 1.50143600 | 98.673 |
| 41 | −208.055465305 | 0.700000000 | HE | 0.99971200 | 102.289 |

TABLE 2-continued

M1649a

| Surface | Radius | Thickness | Glasses | Refractive Index 193.304 nm | ½ Free Diameter |
|---|---|---|---|---|---|
| 42 | 1182.181885936 | 40.462877050 | CAF2HL | 1.50143600 | 113.699 |
| 43 | −275.059004135 | 0.000000000 | HE | 0.99971200 | 115.480 |
| 44 | Infinity | 4.499000000 | HE | 0.99971200 | 115.366 |
| 45 | 1047.795255328 | 31.392914078 | CAF2HL | 1.50143600 | 117.911 |
| 46 | −395.614261534 | 0.700000000 | HE | 0.99971200 | 117.992 |
| 47 | 284.811208676 | 40.095643635 | CAF2HL | 1.50143600 | 114.217 |
| 48 | −822.040097050 | 25.559296680 | HE | 0.99971200 | 112.963 |
| 49 | −230.468653441 | 12.000000000 | SIO2 | 1.56028900 | 111.553 |
| 50 | −1740.772555558 | 16.496567642 | HE | 0.99971200 | 112.486 |
| 51 | −384.661514825 | 35.655800394 | SIO2 | 1.56028900 | 112.495 |
| 52 | −216.196472563 | 0.700000000 | HE | 0.99971200 | 114.658 |
| 53 | 166.072770698 | 31.752863257 | SIO2 | 1.56028900 | 101.831 |
| 54 | 515.781794736 | 0.700000000 | HE | 0.99971200 | 99.354 |
| 55 | 136.216120952 | 28.320295414 | SIO2 | 1.56028900 | 87.888 |
| 56 | 324.185504117 | 12.445936974 | HE | 0.99971200 | 83.547 |
| 57 | 2205.751425211 | 12.000000000 | SIO2 | 1.56028900 | 80.947 |
| 58 | 315.974328907 | 0.700000000 | HE | 0.99971200 | 71.831 |
| 59 | 128.655046396 | 35.172368748 | SIO2 | 1.56028900 | 65.168 |
| 60 | 57.302742004 | 1.258423244 | HE | 0.99971200 | 42.354 |
| 61 | 54.304405296 | 34.782435109 | CAF2HL | 1.50143600 | 41.547 |
| 62 | 328.210777698 | 3.191995120 | HE | 0.99971200 | 30.793 |
| 63 | Infinity | 3.000000000 | SIO2 | 1.56028900 | 28.819 |
| 64 | Infinity | 12.000000000 | L710 | 0.99998200 | 27.177 |
| 65 | | | | | 13.603 |

L710 is air at 950 mbar.
Aspheric Constants
 Zernike component of the aspheric surface No. 21

| ZER9 = | 246.393 µm |
|---|---|
| ZER16 = | 7.96520 µm |
| ZER25 = | 1.39532 µm |
| ZER36 = | 0.117584 µm |
| ZER49 = | −0.0032066 m | relative to a half free diameter of 76.026 mm.
Aspheric Coefficients

| K0 = | −31597.65 nm |
|---|---|
| K4 = | 0 |
| K9 = | 57834.73 nm |
| K16 = | 29505.91 nm |
| K25 = | 3835.77 nm |
| K36 = | 655.93 nm |
| K49 = | 133.64 nm |
| K64 = | 23.24 nm |

Figure 4:
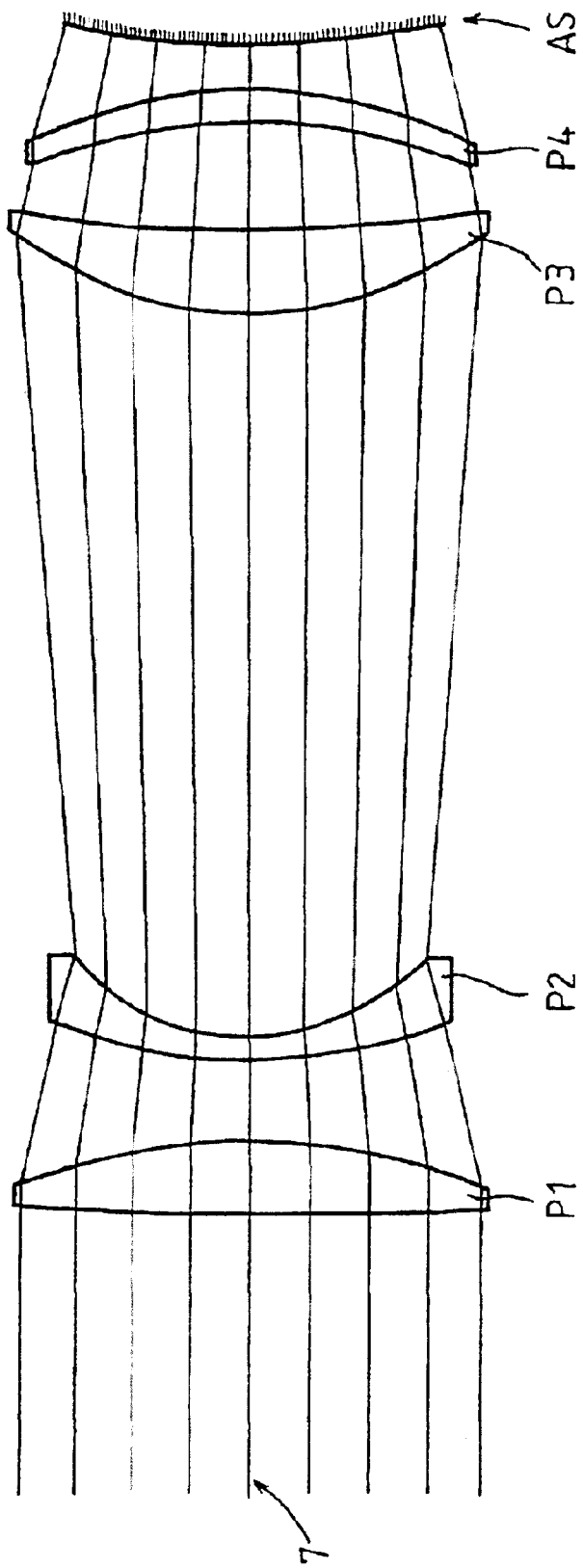
FIG. 4 shows a test arrangement for the aspheric lens used in FIG. 2.

A possible construction of a test optics suitable for testing the optical properties of the aspheric lens surfaces contained in FIGS. 2 and 3 is shown in FIG. 4. This test optics comprises 4 spherical lenses T1–T4 of quartz glass. The length of this test structure is 480 mm. The working distance, i.e., the distance between the last lens of the test optics and the aspheric lens surface to be tested, is 20 mm. A test object of up to a maximum diameter of 155.4 mm can be tested with this test optics. The input diameter of the test optics is 192.107. The maximum diameter of this test optics is 193.874 mm. The deviation from the ideal wavefront is 0.384 with a test wavelength of 632.8 nm. This residual error can be computer compensated.

This test optics is distinguished in that it is isoplanatic. The isoplanatic correction of the K-optics is valuable, since it contains the imaging scale with imaging of the aspheric lens surface from the middle to the edge on the interference image which arises. A constant lateral resolution is thereby obtained in testing asperics. Because of the interference pattern which results on irradiation with a plane wavefront, the surface shape of the aspheric lens surface is determined by means of the interference pattern which appears.

The exact lens data of the test optics can be gathered from Table 3.

TABLE 3

| Lens | Radius | Thickness | Material | Diameter | sin i |
|---|---|---|---|---|---|
| P1 | 1695.617 | 30.807 | SIO2 | 192.11 | 0.057 |
|  | −263.187 | 34.771 |  | 191.75 | 0.555 |
| P2 | 213.537 | 10.000 | SIO2 | 161.68 | 0.172 |
|  | 97.451 | 308.777 |  | 146.57 | 0.800 |
| P3 | 154.172 | 36.663 | SIO2 | 193.87 | 0.686 |
|  | 595.848 | 45.306 |  | 190.04 | 0.043 |
| P4 | −246.667 | 13.677 | SIO2 | 181.65 | 0.548 |
|  | −206.476 | 20.000 |  | 181.48 | 0.652 |

LIST OF REFERENCE NUMERALS

1 Projection exposure device
2 Illumination device
5 Projection objective
7 Optical axis
9 Mask
11 Mask holder
13 Image plane
15 Wafer, substrate
17 Substrate holder
19 Lens arrangement
AP Aperture diaphragm
 We claim:
 1. Lens with at least one aspheric lens surface, wherein, on describing the aspheric lens surface by means of Zernike polynomials, the following holds for the aspheric lens surface:

$$P(h) = \frac{h^2}{R\left(1+\sqrt{1-\frac{h^2}{R^2}}\right)} + K0 + K4*Z4 + K9*Z9 + K10*Z16 +$$

$$K25*Z25 + K36*Z36 + K49*Z49 + K64*Z64$$

with

Z4=(2×h2−1)

Z9=(6h4−6h2+1)

Z16=(20h6−30h4+23h2−1)

Z25=(70h8−140h6+90h4−20 h2+1)

Z36=(252h10−630h8+560h6−210h 4+30 h2−1)

Z49=(924h12−27.72h 10+h3150h8−1680h6+h420h4−42h2+1)

Z64=(3432h14−12012h12+16632h110−h11550h8+4200h6−756h4+56h2−1)

where P is the sagitta as a function of a normed radial distance h from an optical axis:

$$h = \frac{\text{distance from the optical axis}}{\frac{1}{2}(\text{lens diameter of the aspheric})} = normed\ radius$$

$$0 < h \leq 1$$

and wherein at least two of the following conditions are fulfilled:

$$\left|\frac{K16}{K9}\right| < 0.7 \quad (a)$$

$$\left|\frac{K25}{K9}\right| < 0.1 \quad (b)$$

$$\left|\frac{K36}{K9}\right| < 0.02 \quad (c)$$

the radius of the aspheric lens surface being fixed so that K4=0.

2. Lens with at least one aspheric lens surface according to claim 1, wherein $$\text{for (a), } \left|\frac{K16}{K9}\right| < 0.6,$$

$$\text{and/or for (b), } \left|\frac{K25}{K9}\right| < 0.07,$$

$$\text{and/or for (c), } \left|\frac{K36}{K9}\right| < 0.015.$$

3. Lens according to claim 1, where in the aspheric lens surface fulfills all three conditions (a) through (c).

4. Lens, particularly for microlithography, with at least one aspheric lens surface, wherein the aspheric lens surface is described by:

$$P(h) = \frac{h^2}{R\left(1+\sqrt{1-\frac{h^2}{R^2}}\right)} + K0 + K4*Z4 + K9*Z9 + K10*Z16 +$$

$$K25*Z25 + K36*Z36 + K49*Z49 + K64*Z64$$

with

Z4=(2×h2−1)

Z9=(6h4−6h2+1)

Z16=(20h6−30h4+23h2−1)

Z25=(70h8−140h6+90h4−20 h2+1)

Z36=(252h10−630h8+560h6−210h 4+30 h2−1)

Z49=(924h12−27.72h 10+h3150h8−1680h6+h420h4−42h2+1)

Z64=(3432h14−12012h12+16632h110−h11550h8+4200h6−756h4+56h2−1)

where P is the sagitta as a function of a normed radial distance h from an optical axis:

$$h = \frac{\text{distance from the optical axis}}{\frac{1}{2}(\text{lens diameter of the aspheric})} = normed\ radius$$

$$0 < h \leq 1$$

and the resulting components, when using the normed radius, do not exceed the following values:

(a) K9*Z9≦300 μm, and/or (b) K16*Z16≦10 μm, and/or (c) K25*Z25≦2 μm, and/or (d) Kc*Zc≦1 μm for all c>35.

5. Lens according to claim 1 or 4, wherein the aspheric lens surface is provided on a convex lens surface.

6. Objective, wherein the objective includes at least one lens according to claim 1 or 4.

7. Objective according to claim 6, wherein the objective is a microlithography objective.

8. Projection objective comprising at least a first and a second convexity region, wherein at least one lens with an aspheric lens surface according to claim 1 or 4 is arranged in the lens groups up to and including the second convexity.

9. Objective according to claim 8, wherein a lens surface is arranged adjacent to the aspheric lens surface and has a radius different by less than 30% from the radius of the aspheric lens surface.

10. Projection exposure device for microlithography, wherein it contains a projection objective according to claim 8.

11. Method of producing microstructured components, in which a substrate provided with a photosensitive layer is exposed by means of a mask and a projection exposure device with a lens arrangement which contains at least one lens with an aspheric lens surface according to claim 1 or 4.

12. Method of generating new objective designs, wherein for aspheric lens surfaces provided in the design, the lens surfaces are according to claim 1 or 4.

* * * * *